(12) United States Patent
Kojovic et al.

(10) Patent No.: US 6,313,623 B1
(45) Date of Patent: Nov. 6, 2001

(54) HIGH PRECISION ROGOWSKI COIL

(75) Inventors: Ljubomir A. Kojovic; Veselin Skendzic, both of Racine; Stephen E. Williams, Franklin, all of WI (US)

(73) Assignee: McGraw-Edison Company, Houston, TX (US)

( * ) Notice: Subject to any disclaimer, the term of this patent is extended or adjusted under 35 U.S.C. 154(b) by 0 days.

(21) Appl. No.: 09/496,668

(22) Filed: Feb. 3, 2000

(51) Int. Cl.$^7$ ........................................... G01R 1/14
(52) U.S. Cl. ................................................ 324/127
(58) Field of Search .................... 324/127, 524, 324/117 R; 336/174, 175, 200, 229, 225

(56) References Cited

U.S. PATENT DOCUMENTS

| | | |
|---|---|---|
| 4,709,205 | 11/1987 | Baurand et al. . |
| 4,933,630 | 6/1990 | Dupraz . |
| 4,939,449 | 7/1990 | Cattaneo et al. . |
| 5,414,400 | 5/1995 | Gris et al. . |
| 5,442,280 | 8/1995 | Baudart . |
| 5,461,309 | * 10/1995 | Baudart ................. 324/127 |
| 5,852,395 | 12/1998 | Bosco et al. . |

OTHER PUBLICATIONS

G. Schett et al., "The Intelligent GIS–A Fundamental Change in the Combination of Primary and Secondary Equipment", CIGRE, 1996, Switzerland, pp. 1–10.

V. Heumann, "Magnetischer Spannungsmesser Hoher Praazision," Elektrotechnische Zeitschrift Ausgabe A, May 21, 1962, Germany, pp. 349–356.

Ljubomir Kojovic, "Regowski Coils Suit Relay Protection and Measurement"; Jul. 1997, pp. 47–52.

E. Thuries, et al.; "Contribution of Digital Signal Processing in the Field of Current Transformers"; 1996, pp. 1–11.

T & M Research Products Inc., "Current Viewing Probe"; pp. 35 and 36.

P. Mahonen et al., "The Rogowski Coil and the Voltage Divider in Power System Protection and Monitoring"; 1996, pp. 1–7.

* cited by examiner

*Primary Examiner*—Safet Metjahic
*Assistant Examiner*—Etienne LeRoux
(74) *Attorney, Agent, or Firm*—Fish & Richardson P.C.

(57) ABSTRACT

A Rogowski coil measures a current in a conductor and includes first and second loops electrically connected in series with each other. The first loop is wound with a substantially constant winding density in a first direction around a first core that has a substantially constant cross section. The second loop is wound with a substantially constant winding density in a second direction around a second core that has a substantially constant cross section. A direction of the first loop is substantially perpendicular to the normal of the first core cross section. Moreover, a direction of the second loop is substantially perpendicular to the normal of the second core cross section.

29 Claims, 14 Drawing Sheets

HIGH PRECISION ROGOWSKI COIL

BACKGROUND

Rogowski coils measure magnetic fields. Early Rogowski coils could not be used for current measurements since the coil output voltage and power were not sufficient to drive measuring equipment. With the introduction of microprocessor-based protection and measurement equipment, Rogowski coils have become more suitable for use in such equipment. Prior to the advent of microprocessor-based equipment, current transformers (CTs) had been used for protection and measurement applications in part because of their ability to produce the high power output needed by electromechanical equipment.

SUMMARY

In one general aspect, a Rogowski coil measures a current in a conductor and includes first and second loops electrically connected in series with each other. The first loop is wound with a substantially constant winding density in a first direction around a first core that has a substantially constant cross section. The second loop is wound with a substantially constant winding density in a second direction around a second core that has a substantially constant cross section. The directions of the loops are substantially perpendicular to the normal of the core cross sections.

Implementations may include one or more of the following features. For example, a voltage induced in a Rogowski coil placed around an electrical conductor may be measured across the first and second loops of the coil.

The first loop may be wound by tracing the first loop on a first printed circuit board and the second loop may be wound by tracing the second loop on a second printed circuit board. The first and second loops may make up a first set of loops, and the Rogowski coil may further include one or more second sets of loops that are identical in design to the first set of loops. The one or more second sets of loops may be traced on a respective set of printed circuit boards and may be connected in series to the first and second loops of the first set of loops.

The first and second cores may be non-magnetic.

The first and second loops may be variable in shape. The first loop may be wound by tracing the first loop on a first variably-shaped core on a first printed circuit board, and the second loop may be wound by tracing the second loop on a second variably-shaped core on a second printed circuit board. Alternatively, the first and second loops may be traced on a variably-shaped core on a single printed circuit board. A variably-shaped core includes two or more straight sections coupled by two or more rounded sections. A rounded section may span between around 0° to 360° of a complete circle.

For example, the first and second loops may be rectangular in shape. The first loop may be wound by tracing the first loop on a first rectangular core on a first printed circuit board, and the second loop may be wound by tracing the second loop on a second rectangular core on a second printed circuit board. Alternatively, the first and second loops may be traced on a single printed circuit board. A rectangular core includes four straight sections coupled by four rounded sections. A rounded section may span about 90° of a complete circle.

Similarly, the first and second loops may be elliptical in shape. The first loop may be wound by tracing the first loop on a first elliptical core on a first printed circuit board, and the second loop may be wound by tracing the second loop on a second elliptical core on a second printed circuit board. Likewise, the first and second loops may be traced on an elliptical core on a single printed circuit board. An elliptical core includes two straight sections coupled by two rounded sections. A rounded section may span about 180° of a complete circle.

Additionally, the first and second loops may be triangular in shape. The first loop may be wound by tracing the first loop on a first triangular core on a first printed circuit board, and the second loop may be wound by tracing the second loop on a second triangular core on a second printed circuit board. Likewise, the first and second loops may be traced on a triangular core on a single printed circuit board. A triangular core includes three straight sections coupled by three rounded sections. A rounded section may span between around 0° to 180° of a complete circle.

The first and second loops may be traced on a variably-shaped core on a single printed circuit board, the variably-shaped core including two or more straight sections coupled by two or more magnetically shielded joints. Alternatively, the first loop may be traced on a first variably-shaped core on a first printed circuit board, and the second loop may be traced on a second variably-shaped core on a second printed circuit board. The first and second variably-shaped cores include two or more straight sections coupled by two or more magnetically shielded joints.

The first and second loops may be a first set of loops, and the Rogowski coil may further include one or more additional sets of loops. Each additional set of loops is designed identically to the first set of loops. Each set of loops may measure a current through an electrical conductor that is placed within the set of loops. The Rogowski coil may be used to measure phase currents in a multi-phase electrical circuit, where each phase current is determined by measurement across a set of loops. This design is referred to as an integrated Rogowski coil system.

In the integrated Rogowski coil system, the first loop in a set of loops may be wound by tracing the first loop on a first printed circuit board, while the second loop in a set of loops may be wound by tracing the second loop on a second printed circuit board. The integrated Rogowski coil system may further include a first perimeter loop traced on an outer perimeter of the first printed circuit board, and a second perimeter loop traced on an outer perimeter of the second printed circuit board. The first and second perimeter loops measure residual current through electrical conductors placed within the sets of loops.

In the integrated Rogowski coil system, both loops in a set of loops may be traced on a single printed circuit board. The integrated Rogowski coil system may further include first and second perimeter loops traced on an outer perimeter of the printed circuit board. The perimeter loops measure residual current through electrical conductors placed within the sets of loops.

Rogowski coils have many advantages over conventional CTs. For example, Rogowski coils provide high measurement precision because they can be designed to measure currents to better than 0.1% precision, with a typical precision of around 1–3%. Rogowski coils also offer wide measurement range. For example, the same coil can be used to measure currents ranging from several amps to several hundred thousand amps. In addition, Rogowski coils are operable over a wide frequency range, such as from around 0.1 Hz to over around 1 MHz (depending on the design of the coil). Rogowski coils also can be designed to provide a bandpass frequency response of up to around 200 MHz.

Rogowski coils can precisely measure currents that have a large dc component because, unlike CTs, they do not include an iron core that can saturate. Moreover, Rogowski coils can withstand unlimited short-circuit currents.

Rogowski coils can be designed to be very small to permit measurement of currents in restricted areas. Likewise, they can be designed to be either flexible or rigid depending on application requirements.

Rogowski coils can be used to measure current distributions in circuits having very small impedances without affecting the circuits. Rogowski coils are galvanically isolated from the primary conductor. Furthermore, Rogowski coils have relatively low production cost.

Rogowski coils are also suitable for measuring current in a variety of other applications, including, for example, measuring the current distribution in parallel fuses or in parallel bus bars. Rogowski coils can be designed to be long enough to encircle a communication tower or an arc furnace, and therefore can be used to measure the total current through the tower or in the arc furnace.

Other features and advantages will be apparent from the following description, including the drawings, and from the claims.

DETAILED DESCRIPTION

Figure 1:
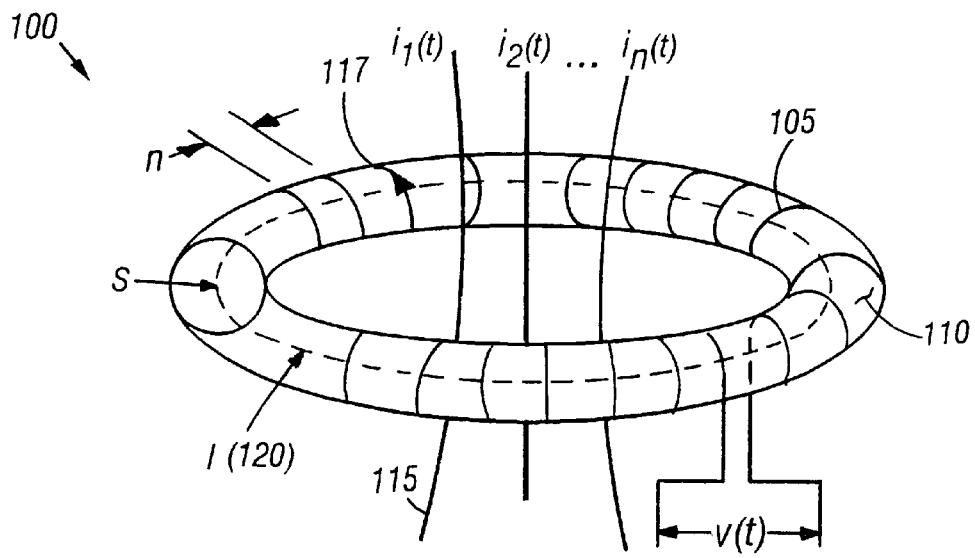
FIG. 1 is an illustration of a basic Rogowski coil.

Referring to FIG. 1, a Rogowski coil 100 includes an electrical conductor or wire 105 wound around a non-magnetic core 110 in which the magnetic permeability $\mu$ is equal to the permeability of free space $\mu_0$ (such as, for example, air). The total number of windings in a coil is designated as N. In use, the Rogowski coil 100 is placed around one or more electrical conductors 115 whose instantaneous current i(t) is to be measured. For alternating current waveforms, the instantaneous current i(t) is given by $I_{max}\sin(\omega t)$, where $I_{max}$ is the amplitude of the current. The voltage v(t) induced in the Rogowski coil is defined by Equation 1:

$$v(t) = -\frac{d}{dt}\left(\sum_{j=1}^{N}\Phi_j\right), \tag{1}$$

where $\Phi_j$ is instantaneous flux for the j-th turn of the total N turns. If the core has a constant cross section S, the wire is wound perpendicularly (in a direction indicated by arrow 117) to a line l 120 that is centered in the cross section S (that is, the middle line l is normal to the core cross section S), and the wire is wound with a constant density equal to n, then Equation 1 may be written as:

$$v(t) = -\mu_0 n S \frac{d}{dt}\left[\sum_j i_j(t)\right] = -M\frac{d}{dt}\left[\sum_j i_j(t)\right], \tag{2}$$

where the mutual reactance M is defined by:

$$M = \mu_0 n S. \tag{3}$$

For the design criteria detailed above, coil mutual reactance M would therefore be independent of the conductor location inside the coil loop. According to Equation 2, the Rogowski coil output voltage v(t) is proportional to the rate of change of the measured current i(t).

Figure 2:
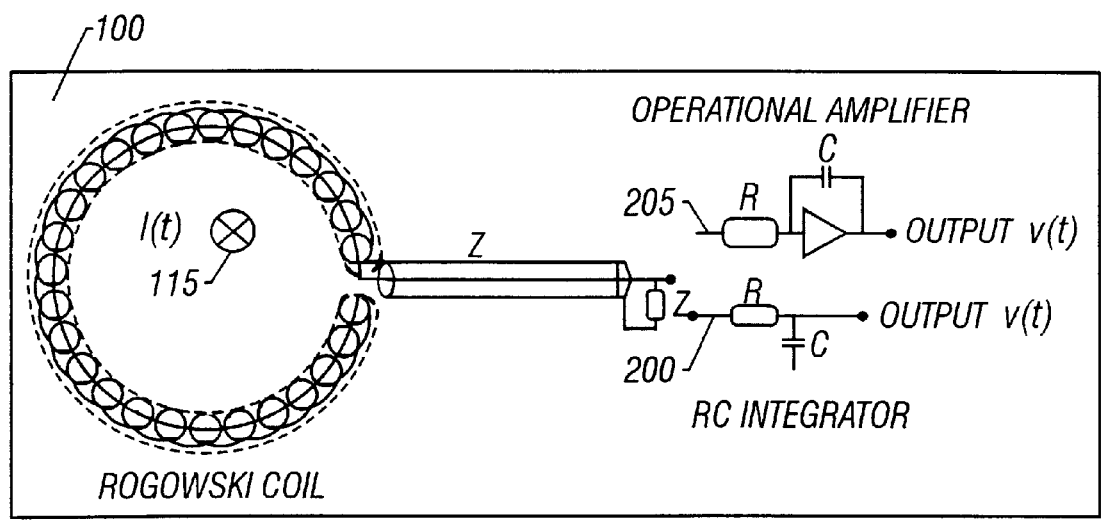
FIG. 2 is a circuit diagram of a circuit for integrating a voltage induced in the Rogowski coil of FIG. 1.

To obtain an expression for the voltage that is proportional to the measured current, the coil output voltage of Equation 3 is integrated as shown in FIG. 2. Output voltage integration may be performed using an RC integrator 200 or an operational amplifier integrator 205. The coil integrated voltage $v_i(t)$ is proportional to the sum of the measured currents:

$$v_i(t) = \frac{M}{RC}\sum_j i_j(t). \tag{4}$$

The coil output voltage does not need to be integrated to measure sinusoidal currents because the differentiation of sinusoidal currents results in sinusoidal waveforms shifted by 90 electrical degrees. This shift does not affect measurement results if only sinusoidal currents are measured. Using the expression for the instantaneous current given above and Equation 2, the coil output voltage is:

$$v(t) = -\mu_0 n S \frac{di}{dt} = -\mu_0 n S \omega I_{max}\cos(\omega t). \tag{5}$$

Therefore, the root-mean-squared voltage $V_{rms}$ is given by:

$$V_{rms} = \mu_0 n S \omega I_{max} = \mu_0 n S \omega \sqrt{2} I_{rms}. \tag{6}$$

Figure 3C:
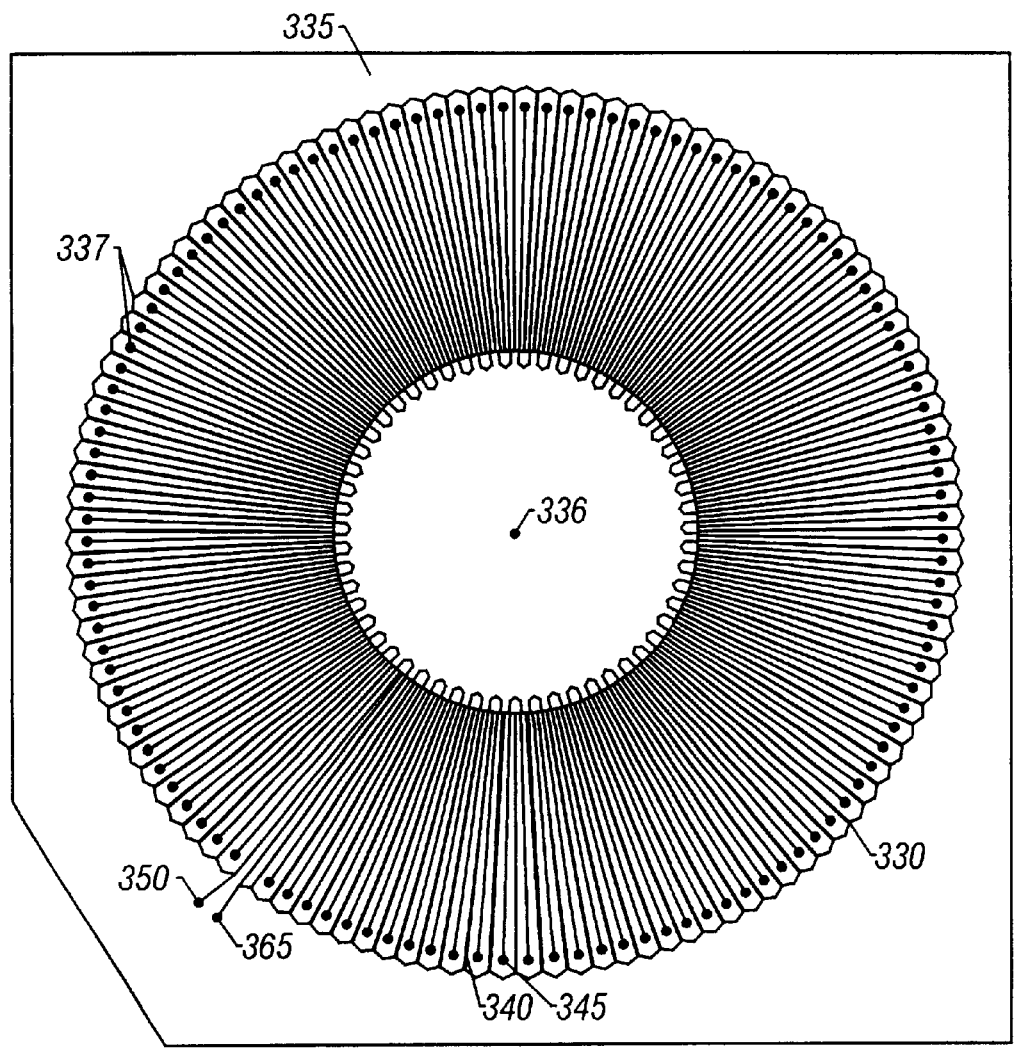
FIG. 3C shows a prior Rogowski design.
Figure 3A:
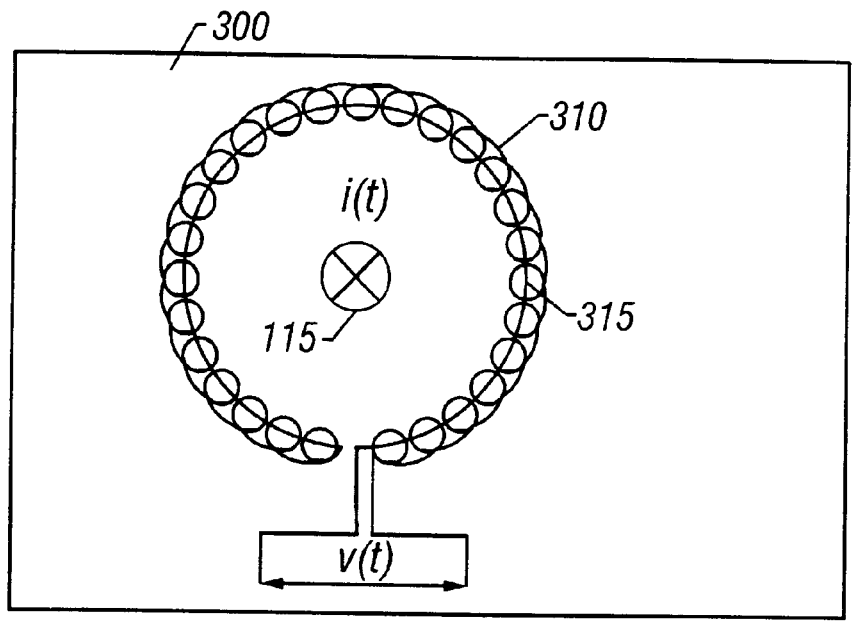
FIGS. 3A and 3B show Rogowski coil designs.
Figure 3B:
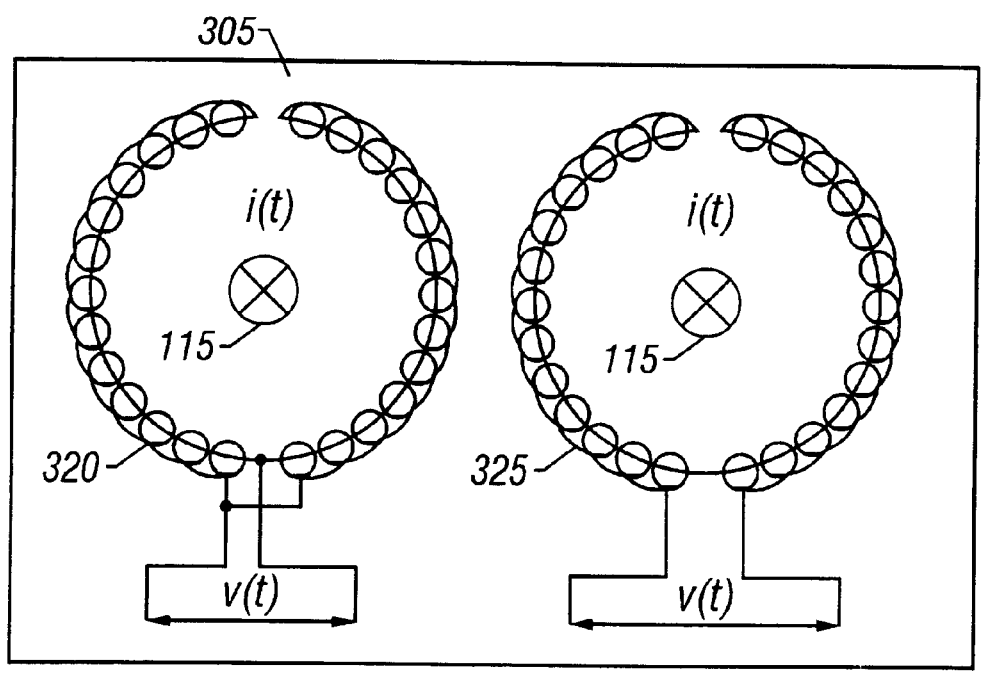

Referring also to FIGS. 3A and 3B, a Rogowski coil is typically designed either as a single-arm coil 300 (in FIG. 3A) or a two-arm coil 305 (in FIG. 3B). To prevent the influence of nearby conductors carrying high currents, Rogowski coils are designed with two wire loops connected in electrically opposite directions. This design cancels all electrical fields coming from outside the coil loop. The first loop 310 is made by winding the wire around the non-magnetic core 100. The other loop 315 is formed by returning the wire through the center of the winding (shown in FIGS. 3A and 3B), or by adding an additional winding wound in the opposite direction over the existing winding. The two-arm coil 305 includes two coils each wound on a half-circle (an arm) from a single wire. The two half-circle coils can be connected in parallel 320 or in series 325.

High performance coils are often designed by winding the wire onto a straight core or section, such as a rod, as opposed to a circular or flexible core. Cross-sectional area can be manufactured more uniformly with rods than with flexible cores such as air. It is also easier to control the winding process on rods than on flexible cores. Such straight sections or cores are joined together at coil corners or ends.

Because the current measurement is dependent on the instantaneous flux through the coil, (see, for example, Equation 1), and because the flux depends on both the winding density n and the core cross-section S, measurement error is increased when the primary conductor is located near the coil corners or ends where the winding density and the core cross-section are not necessarily constant. This is because the winding of the wire is discontinuous at the coil corners or ends. To reduce measuring errors, coil corners or ends can be magnetically shielded using standard blocks of silicon steel laminations. These blocks account for the winding discontinuity at the corners or ends, and they can be removed if necessary during installation to make coil placement easier.

Referring to FIG. 3C, a typical Rogowski coil 330 can be wound by tracing the loops on one or more printed circuit boards (PCBs) 335. A PCB is made of epoxy resin often filled with a substance with a low coefficient of thermal expansion such as glass or a ceramic. The Rogowski coil is traced by depositing copper onto each of the faces of the board. The copper deposits are rectilinear and radial, that is, geometrical projections intersect at the center of the board 336. Deposits on one face are connected to deposits on the opposite face through conductively plated through holes 337 (referred to as vias) passing through the board 335.

On a PCB, various coil shapes can be contemplated and made to measure current more accurately. In FIG. 3C, a circular-shaped coil is realized. Typically, to wind or trace a coil on the PCB 335, the coil is first traced in a clockwise direction (called a first loop 340), and then traced directly on top of and interwoven with the first loop 340 in a counter-clockwise direction (called a second loop 345). Voltage induced in the Rogowski coil 330 is measured across connection pads 350 and 355. Because the two loops of the coil are traced together and interwoven with each other, the two loops are referred to as being "coupled" together. A Rogowski coil that is designed with coupled loops on a single PCB is therefore manufactured using, for example, the winding pattern as seen in FIG. 3C. Because the loops 340, 345 are traced within each other (that is, the loops are interwoven), the loops 340, 345 are not identical in form. In this design, measurement accuracy may be reduced because of the inconsistent cross section of the two loops. To obtain high precision Rogowski coils without the use of magnetic shielding, the following design criteria are applied. First, the coil 105 is wound around the core 110 with a constant winding density (that is, n=constant). Second, the coil 105 is wound around the core 110 with a constant coil cross-section (that is, S=constant). And third, the direction of the coil winding is perpendicular to the direction of the middle line l.

Figure 4:
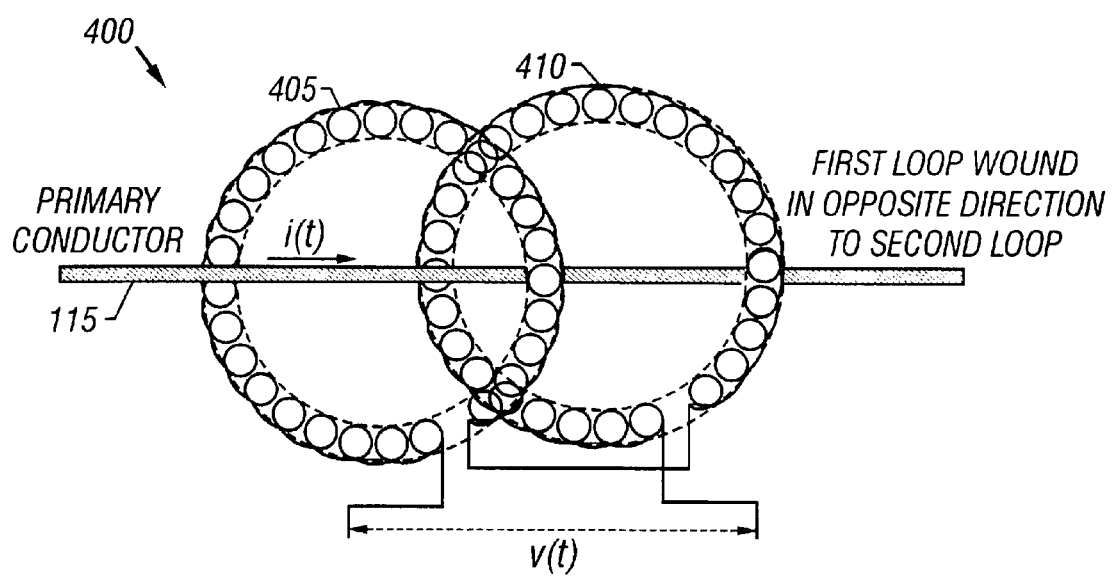
FIG. 4 shows a decoupled Rogowski coil design in which a first loop is separated from a second loop.

Referring to FIG. 4, a two-loop design 400 includes a first loop 405 wound in a clockwise direction and a second loop 410 wound in a counterclockwise direction. Unlike the coupled-loop design described above, the two-loop design 400 has loops that are decoupled from each other. That is, the second loop is not wound to overlap the first loop. The distance that separates the two loops may depend on the required measurement precision. Such a design exhibits improved current measurement accuracy because the loops are identically and separately wound and then located near each other. In such a design, the Rogowski coil can better account for effects of external fields.

Figure 5A:
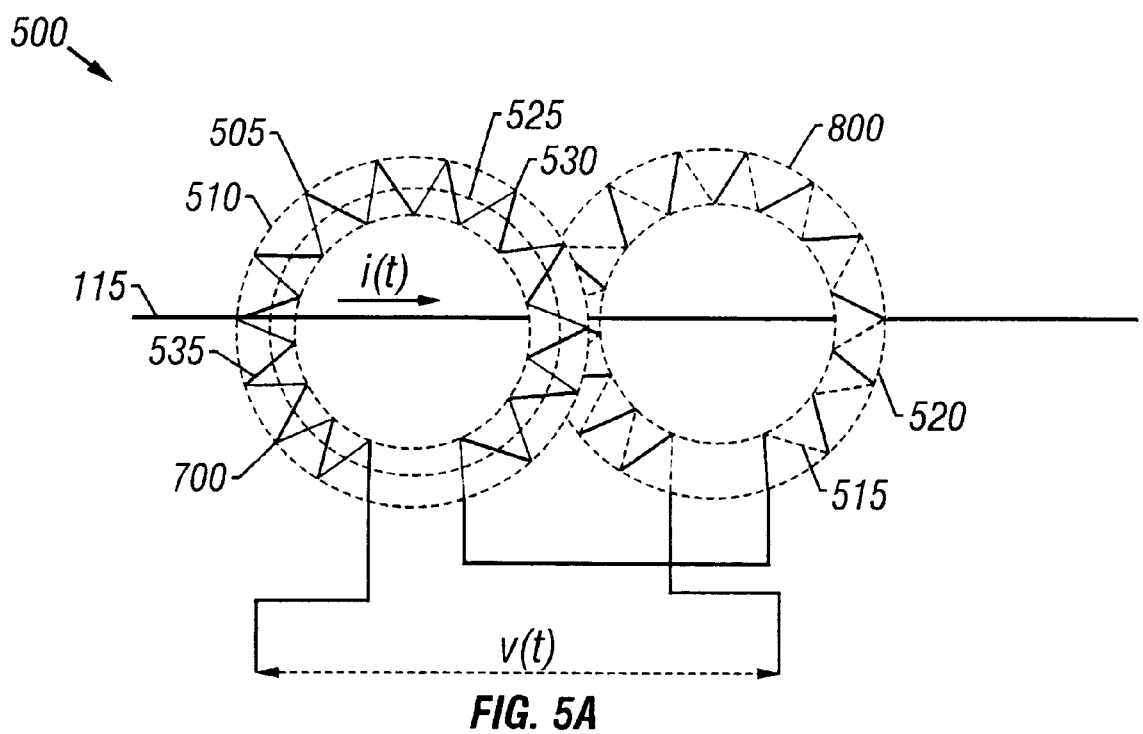
FIG. 5A shows a perspective view of a decoupled Rogowski coil design in which the first loop is traced on a first printed circuit board (PCB) and the second loop is traced on a second PCB.
Figure 5B:
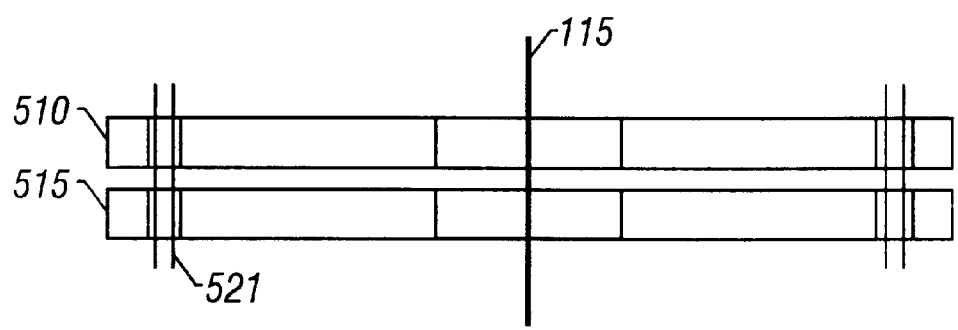
FIGS. 5B and 5C show side cross-sectional views of the decoupled Rogowski coil of FIG. 5A.
Figure 5C:
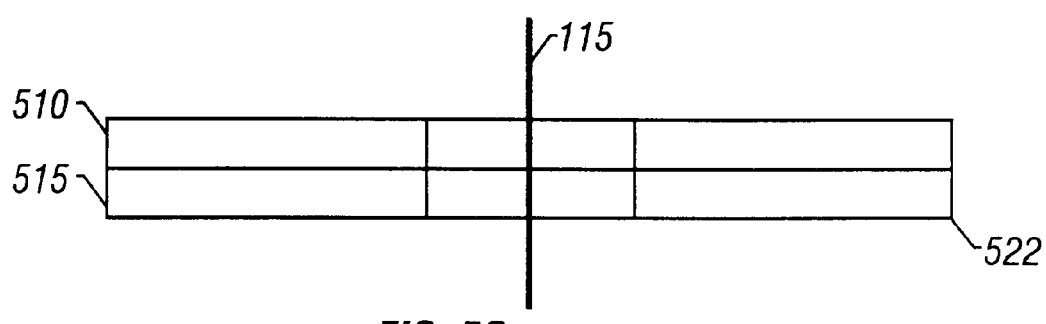

Referring also to FIG. 5A, a two-loop, two-PCB Rogowski coil 500 includes a first loop 505 traced on a first PCB 510 and a second loop 515 traced on a second PCB 520. The loops are traced separately from each other with the loops exhibiting identical geometries. The loops can then be placed very near each other during measurement as shown in FIG. 5A. In FIG. 5A, the first PCB 510 is nearly adjacent to the second PCB 520. In FIG. 5B, rods 521 are used to electrically (and additionally mechanically) join the PCBs 510, 515. The PCBs 510, 515 may be laminated together to form a monolithic PCB assembly 522, as shown in FIG. 5C. The designs of FIGS. 5A–5C exhibit more consistent cross sections, and thus such designs exhibit improved measurement precisions.

The direction of the first loop 505 is shown and the middle line is shown by line 525. Because of the geometrical constraints placed on any design on a PCB, the direction of the traced loop is perpendicular to the middle line at the vias (shown, for example, at vias 530 in FIG. 5A). This is not necessarily so for portions of the loop along the face of the PCB. For example, at point 535 in FIG. 5A, the direction of the traced loop is not perpendicular to the middle line.

Figure 6:
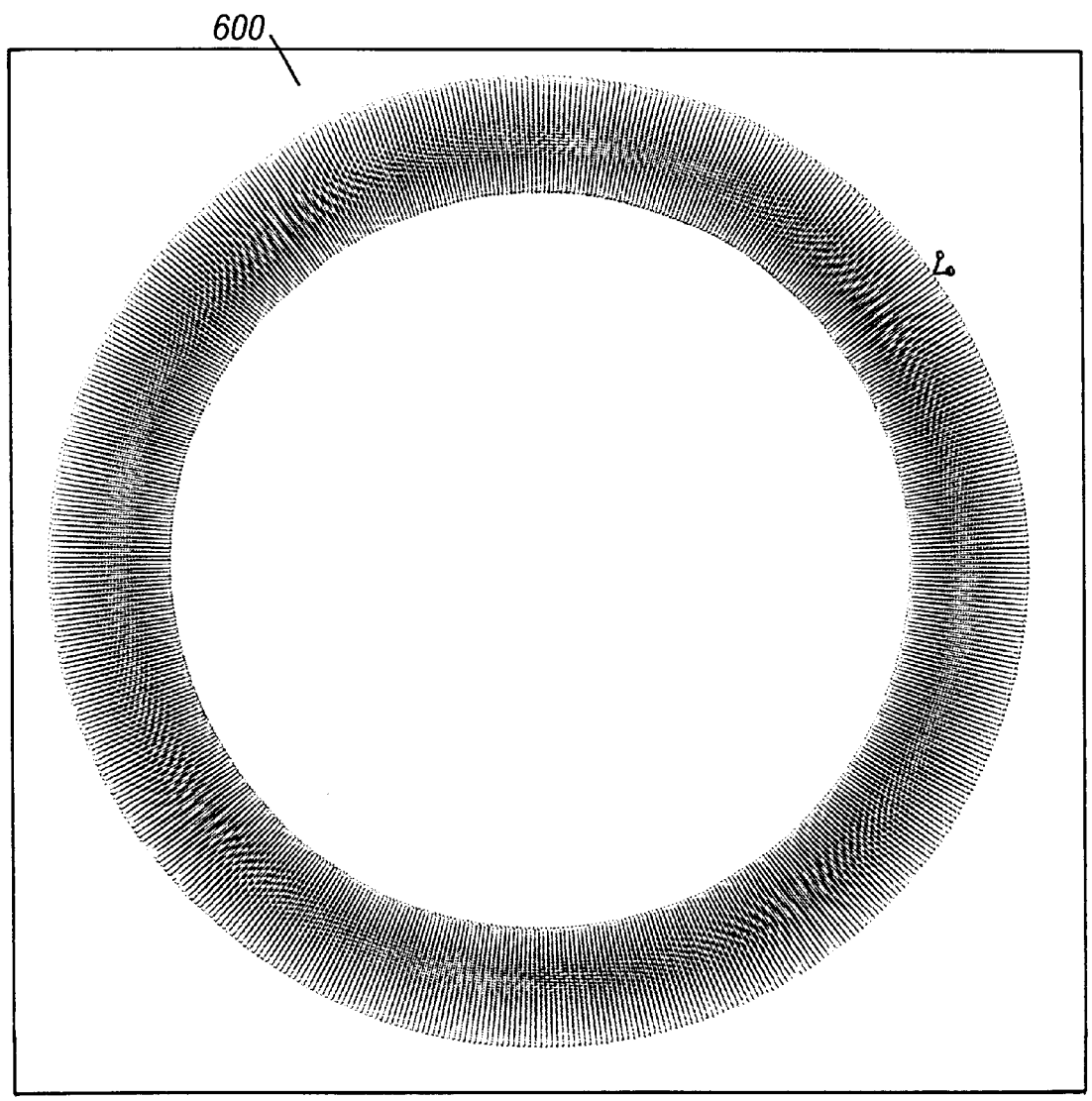
FIG. 6 shows a layout of a single loop wound or traced on a single PCB that is used in the decoupled Rogowski coil of FIG. 5.

However, for a higher density winding (such as the winding geometry in FIG. 6), the direction of the traced loop along the faces is very nearly perpendicular to the middle line. Referring to FIG. 6, the geometry of the design 600 on the PCB is simplified because a single loop, not two interwoven loops, is traced on the PCB. Furthermore, several two-loop, two-PCB Rogowski coils 500 may be connected in series to increase the size of the output signal and to increase sensitivity.

Figure 7:
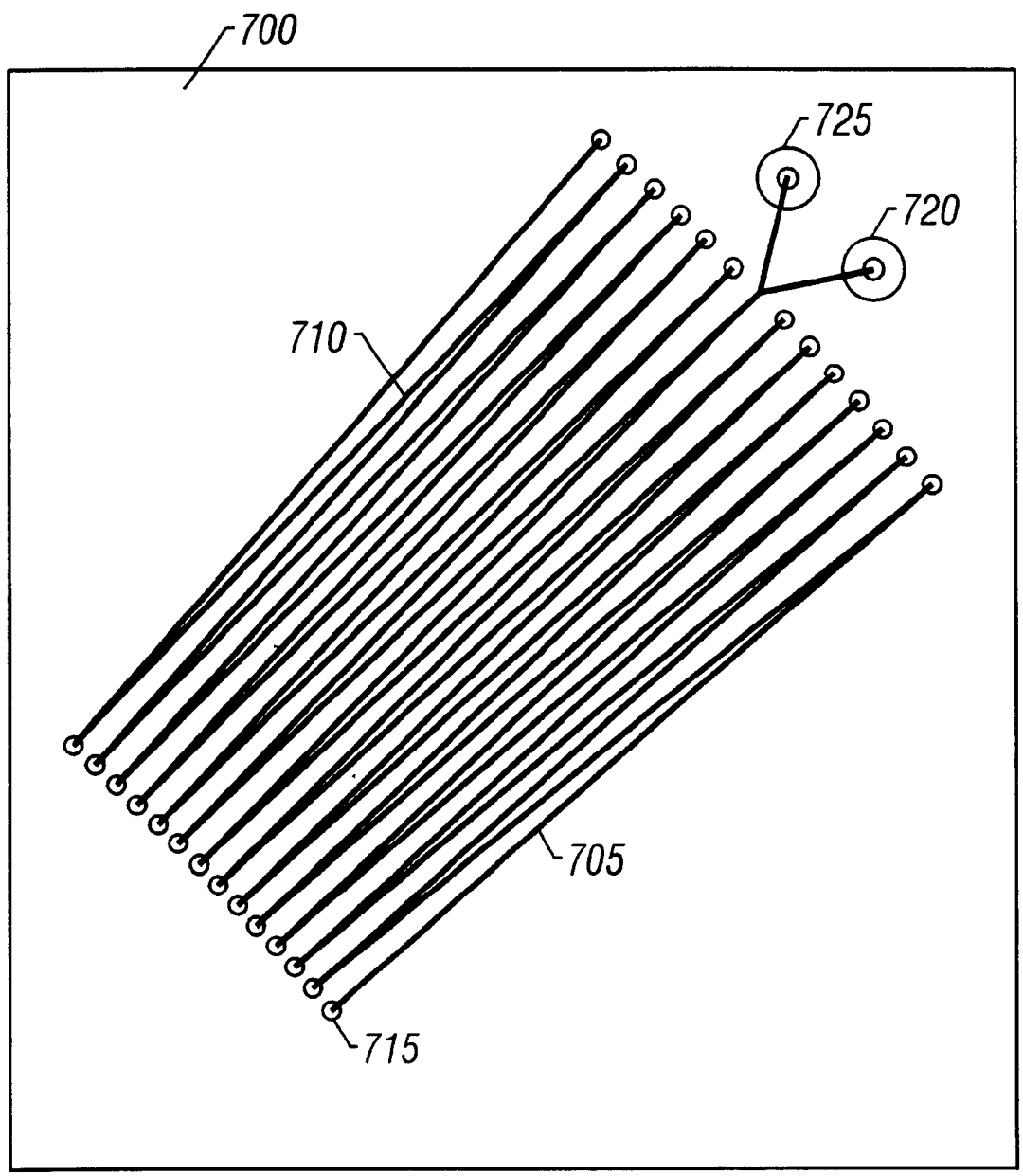
FIGS. 7 and 8 show detailed sections of the PCBs used in the decoupled Rogowski coil of FIG. 5.

FIG. 7 shows a PCB section 700 of a right-handed loop used in the two-loop, two-PCB Rogowski coil 500. The line 705 represents a conductive trace of the loop winding on a top surface (defined as the surface that is visible to the reader) of the PCB and the line 710 represents a conductive trace of the loop winding on a bottom surface (defined as the surface in a direction opposite from the top surface) of the PCB. Therefore, in FIG. 7, the current flows in a counter-clockwise direction around the center of the PCB. The conductive traces on the two surfaces of the PCB are interconnected by conductive-plated holes or vias 715.

Figure 8:
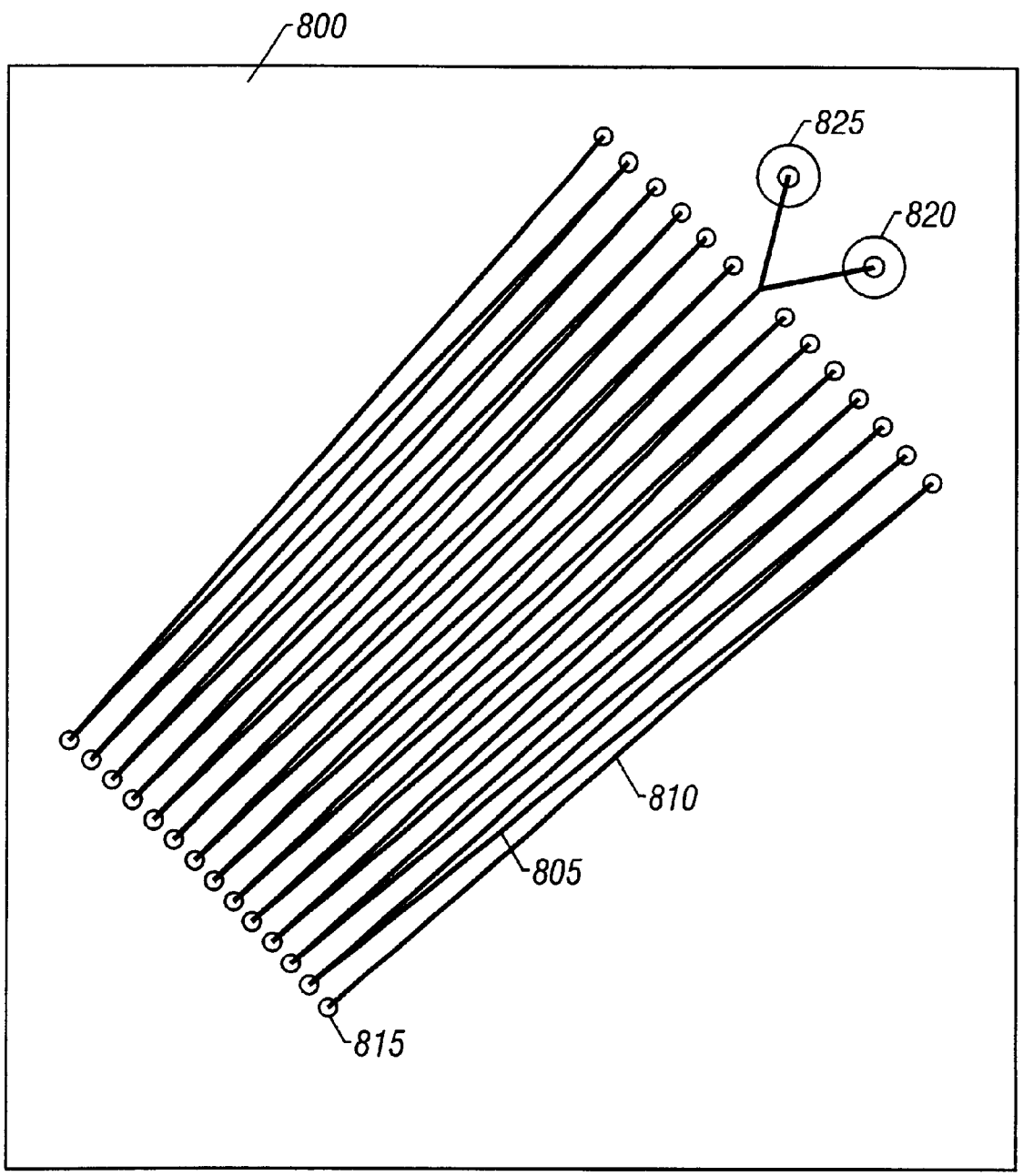

FIG. 8 shows a PCB section 800 of a left-handed loop used in the two-loop, two-PCB Rogowski coil 500. The line 805 represents a conductive trace of the loop winding on the top surface of the PCB and the line 810 represents a conductive trace of the loop winding on the bottom surface of the PCB. Therefore, in FIG. 8, the current flows in a clockwise direction around the center of the PCB. Vias 815 are used to interconnect the conductive traces on the top and bottom surfaces. The left-handed loop on the second PCB provides the return path necessary for achieving a high-precision Rogowski coil.

The two PCBs are connected in series to form the two-loop, two-PCB Rogowski coil 500 with a connection made between a plated connection pad 720 on the right-handed loop 700 and a plated connection pad 820 on the left-handed loop 800. The voltage v(t) induced in the Rogowski coil is then measured across a second plated connection pad 725 on the right-handed loop 700 and a second plated connection pad 825 on the left-handed loop 800.

Figure 9:
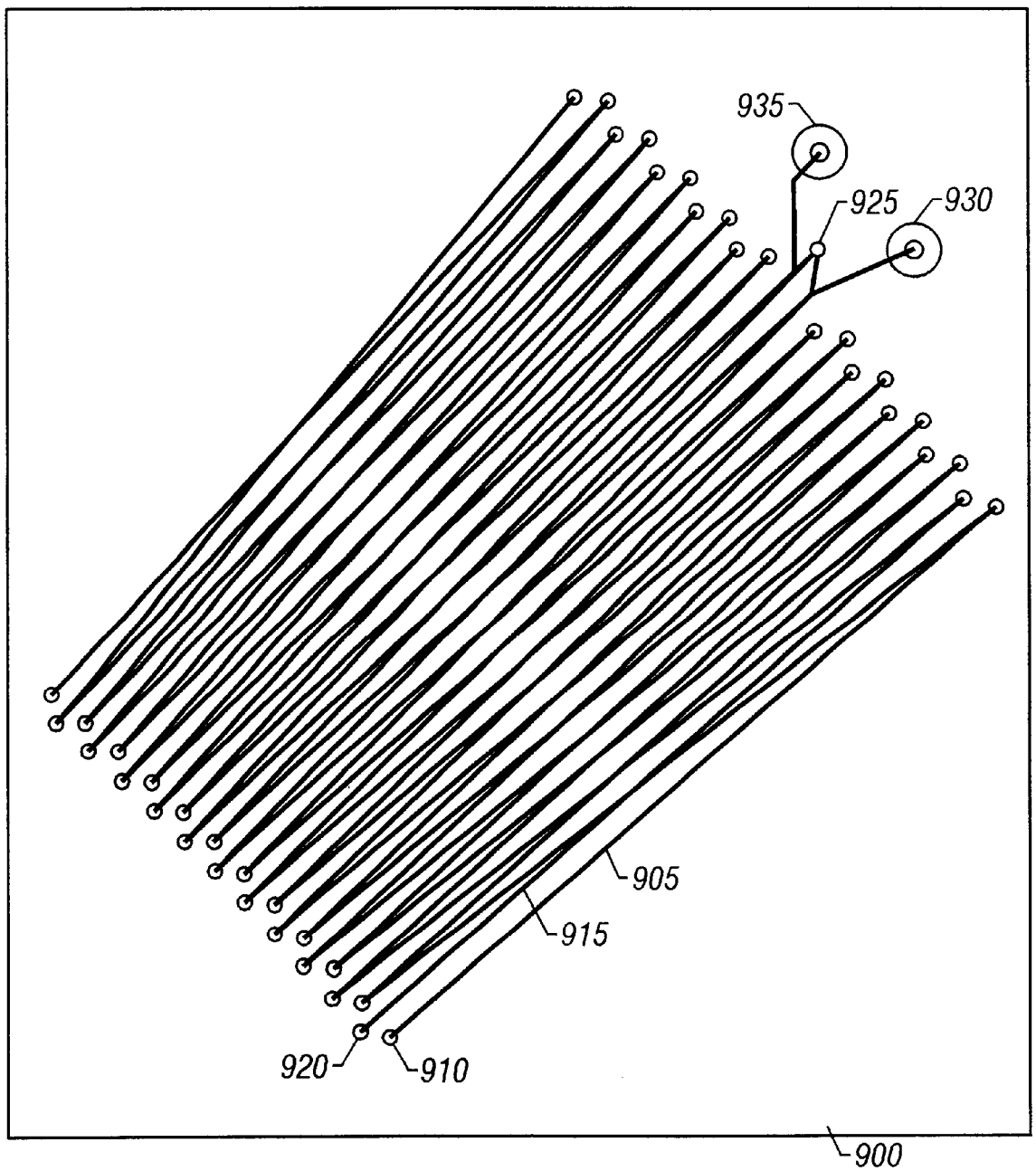
FIG. 9 shows a detailed section of a higher density PCB Rogowski coil.

FIG. 9 shows a section of a higher density PCB Rogowski coil loop 900 in which the number of turns per unit length of the PCB loop is increased by offsetting the conductive-plated holes in, for example, a radial direction to obtain a higher density. The two loops are right-handed and progress in one direction (for example, the counterclockwise direction). The first loop 905 begins the section at conductive-plated hole 910 and the second loop 915 begins the section at conductive-plated hole 920. Alternatively, the two loops may be traced to be left-handed and to progress in another direction (for example, the clockwise direction). The loops 905, 915 progress on alternating printed circuit traces and conductive-plated holes for one complete revolution around the center of the board and are then interconnected in series at conductive-plated hole 925.

The higher density PCB Rogowski coil loop may be used in a two-loop, two-PCB Rogowski coil design as detailed above. In this case, if the first loop were right-handed, like the higher density loop 900 of FIG. 9, then the second PCB would be left-handed with a clockwise higher density progression, and would include two loops connected in series in a similar fashion as the loops 905, 915 in FIG. 9. The higher density right-handed loop 900 is connected in series to the higher density left-handed loop via a connection pad 930 on the right-handed loop 900 and a corresponding connection pad on the left-handed loop. Voltage induced in the higher density two-loop, two-PCB Rogowski coil is measured across a connection pad 935 on the right-handed loop 900 and a corresponding connection pad on the left-handed loop.

Figure 10A:
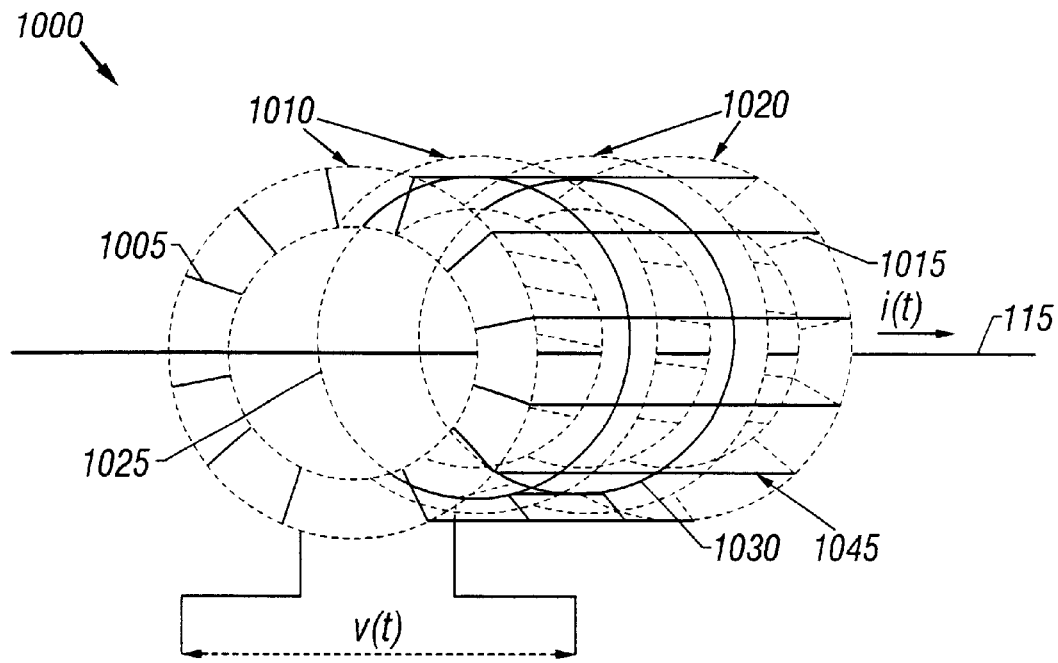
FIG. 10A shows an exploded perspective view of a multi-layer-PCB Rogowski coil design.
Figure 10B:
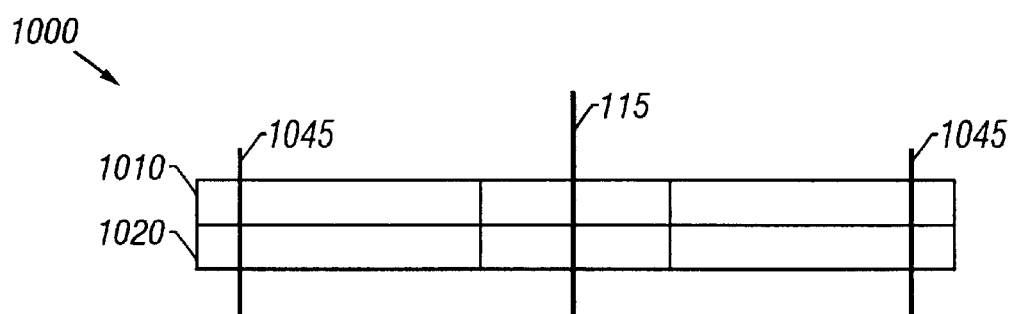
FIGS. 10B and 10C show side cross-sectional views of the multi-layer-PCB Rogowski coil of FIG. 10A.
Figure 10C:
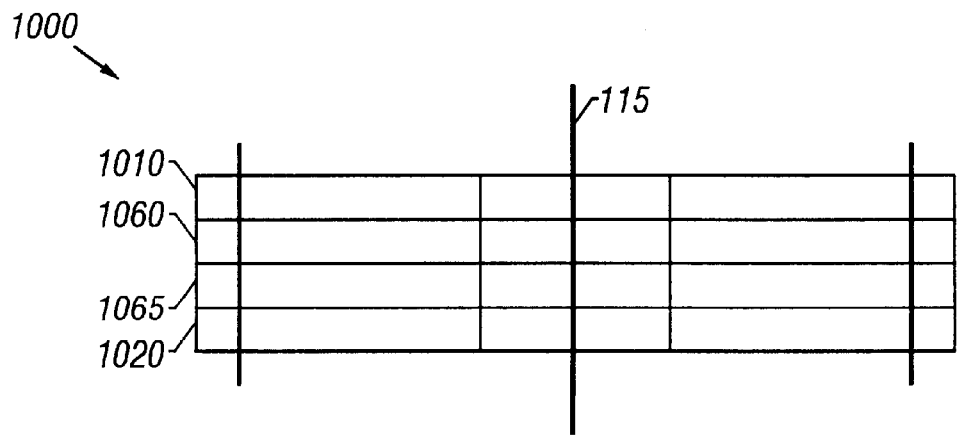

Referring to FIG. 10A, a multi-layer-PCB Rogowski coil 1000 is implemented on two multi-layer or four printed circuit boards. In the two multi-layer design, a first outer loop 1005 is traced on a first PCB 1010, and a second outer loop 1015 is traced on a second PCB 1020. Return conductors 1025, 1030 are printed or traced into, respectively, inner surfaces of the first and second PCBs 1010, 1020. As shown also in FIG. 10B, the loops in the PCBs are connected through conductive vias 1045 positioned and aligned around each of the PCBs 1010, 1020. The conductive vias 1045 are shown schematically as lines in FIG. 10A to demonstrate the electrical connections through the PCBs 1010, 1020. Several multi-layer-PCB Rogowski coils 1000 can be connected in series to further increase the output signal sensitivity. In FIG. 10C, a multi-layer-PCB Rogowski coil 1000 is implemented on four printed circuit boards. In this design, the first outer loop 1005 is traced on a first PCB 1050, and the second outer loop 1015 is traced on a second PCB 1055. The return conductors 1025, 1030 are printed or traced into, respectively, first and second inner PCBs 1060, 1065. Again, the loops are connected through conductive vias 1070 aligned across all four PCBs 1010, 1020, 1060, 1065.

Figure 11A:
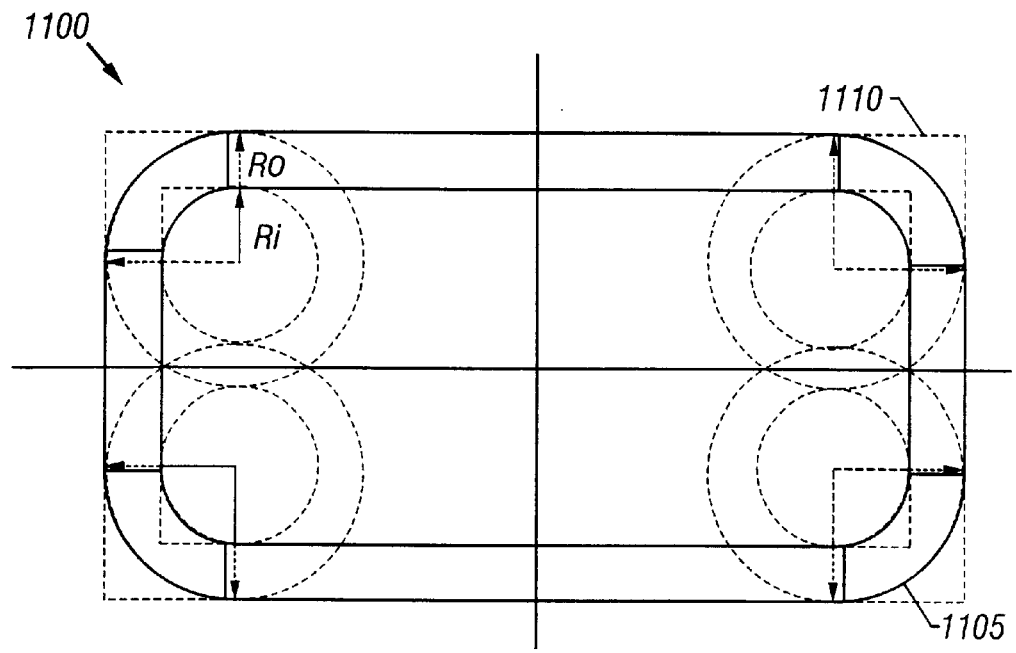
FIGS. 11A–11D show a rectangular Rogowski coil design.

Referring to FIG. 11A, the Rogowski coil may be designed as a rectangular Rogowski coil 1100 with rounded angles 1105 along the corners. As discussed above, higher precision coils are produced when the direction of the coil winding is perpendicular to the core cross section. At the right-angled corners of a rectangular Rogowski coil (shown as dashed straight line 1110 in FIG. 11A), this design criterion is not easily met. Therefore, flux coupling between consecutive loops at the right-angled corners 1110 may be dramatically reduced. Because of this, rounded angles 1105 are designed into the corners of the rectangular Rogowski coil 1100. Each rounded angle is designed as one quarter of a circle, or 90°. With the rounded angle design of FIG. 11A, a higher precision Rogowski coil is obtained.

Figure 11B:
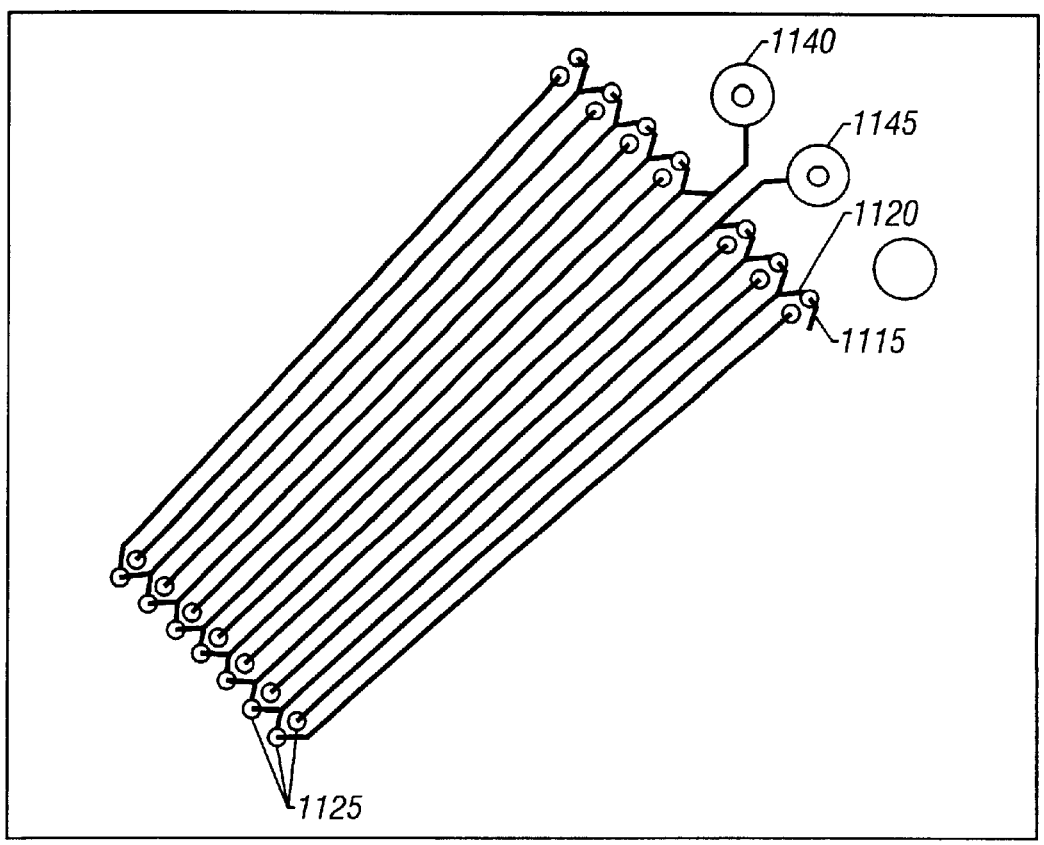
Figure 11C:
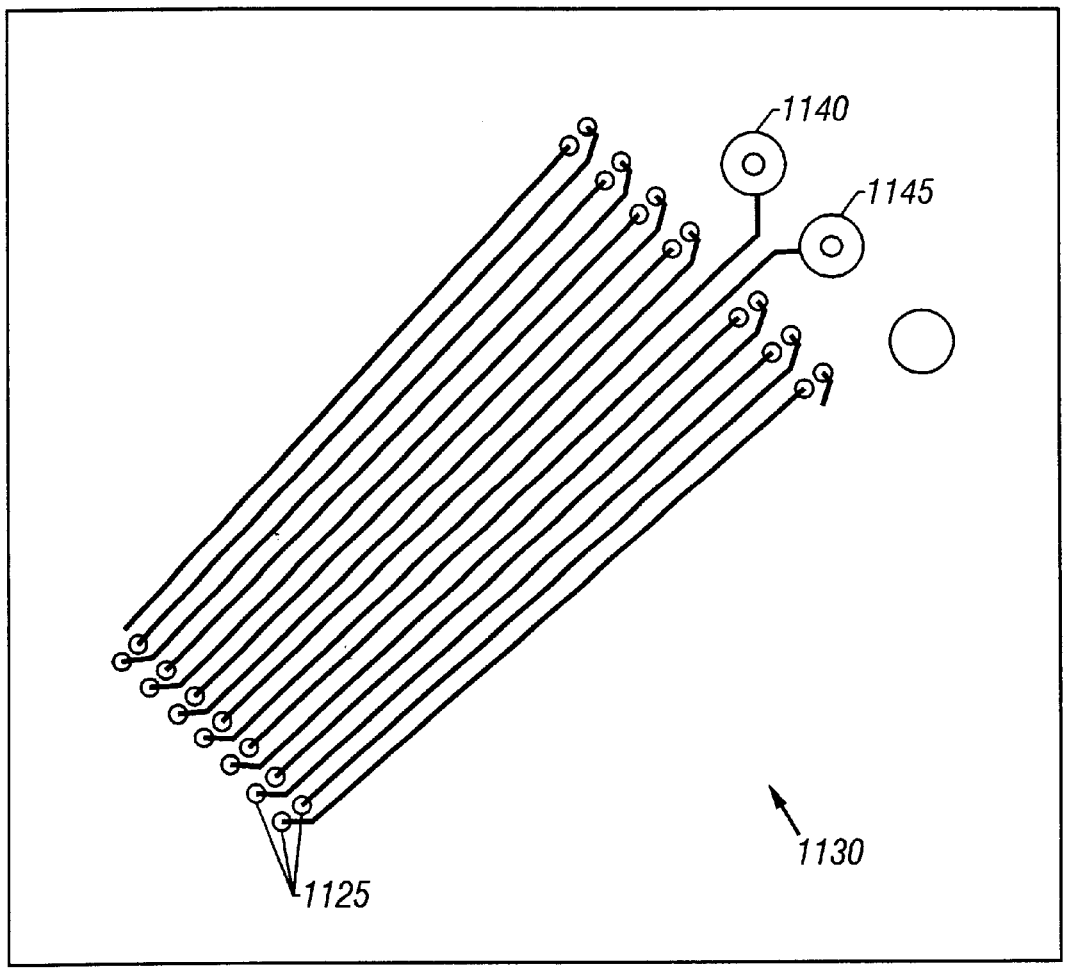
Figure 11D:
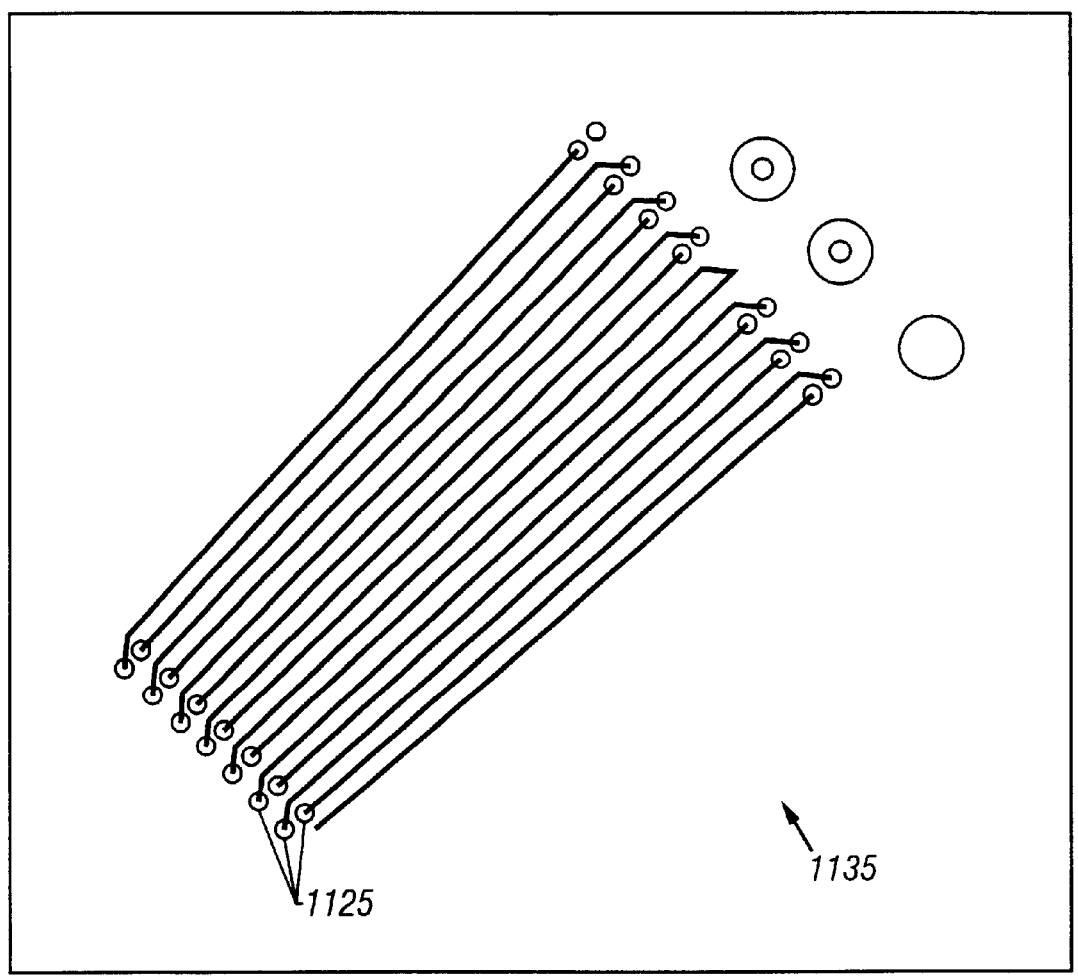

Like the circular Rogowski coil designs, the rectangular Rogowski coil 1100 may be designed on a single PCB in a fashion similar to the coil 330 of FIG. 3C (detailed further in FIGS. 11B–11D) or on two PCBs in a fashion similar to the coils of FIG. 5A. Referring to FIGS. 11B–11D, the single PCB rectangular Rogowski coil 1100 includes top and bottom loops 1115, 1120. One loop is right-handed and progresses in a counterclockwise direction around the center of the PCB, while the other loop is left-handed and progresses in a clockwise direction around the center of the PCB. These two loops are connected in series to form the Rogowski coil 1100. Conductive-plated holes 1125 connect the traces on each side of the PCB in each of the loops. FIG. 11C shows the top trace 1130 of the loops, while FIG. 11D shows the bottom trace 1135 of the loops. To make these drawings understandable, the two radially extending portions of the same turn in the loops (that is, the long straight sections of the loops) lie exactly one over the other on the two opposite faces of the PCB. Voltage through the rectangular Rogowski coil 1100 is measured across connection pads 1140, 1145.

Alternatively, as mentioned above, the rectangular Rogowski coil 1100 may be implemented as a two-loop, two-PCB rectangular Rogowski coil with rounded angles in a similar fashion to the two-loop, two-PCB Rogowski coil of FIG. 5A.

The higher precision Rogowski coil could, in theory, be designed with an unlimited number of rounded angles that connect straight sections at corners or ends such as the rectangular Rogowski coil 1100. The tangent to the middle line of the rounded angle is equal to the tangent to the middle line of the straight section at the point where the rounded angle joins with the straight section. As long as the design criteria for higher precision coils are followed, the resultant Rogowski coil would exhibit such improved current measurement characteristics. For example, the variable-shaped Rogowski coil is designed with a coil of constant winding density and constant core cross section. Additionally, the direction of the coil winding is perpendicular to the normal of the core cross section. Thus, the variable-shaped Rogowski coil would have improved measurement precision.

Figure 12:
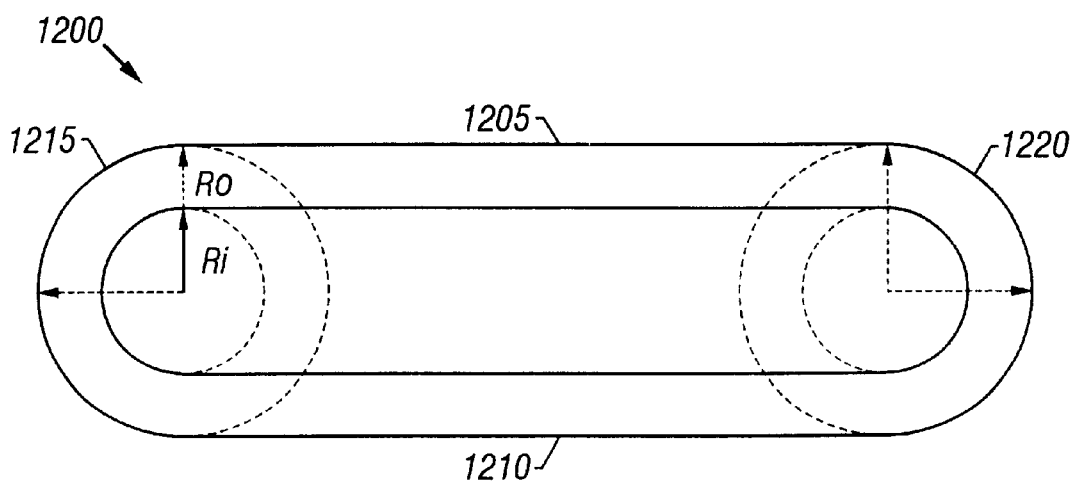
FIGS. 12 and 13 show Rogowski coils having different shapes.

Referring to FIG. 12, for example, a higher precision elliptical Rogowski coil 1200 is shown with two straight sections 1205, 1210 and two rounded ends 1215, 1220 connecting the straight sections 1205, 1210. In this design, to maintain high precision, the otherwise four sharp corners of the rectangle are formed into two half circles. The elliptical Rogowski coil 1200 may be designed as a single-PCB elliptical Rogowski coil in a similar fashion as the coil 330 of FIG. 3C, or as a two-loop, two-PCB elliptical Rogowski coil as detailed above with respect to the circular and rectangular higher precision coils.

Figure 13:
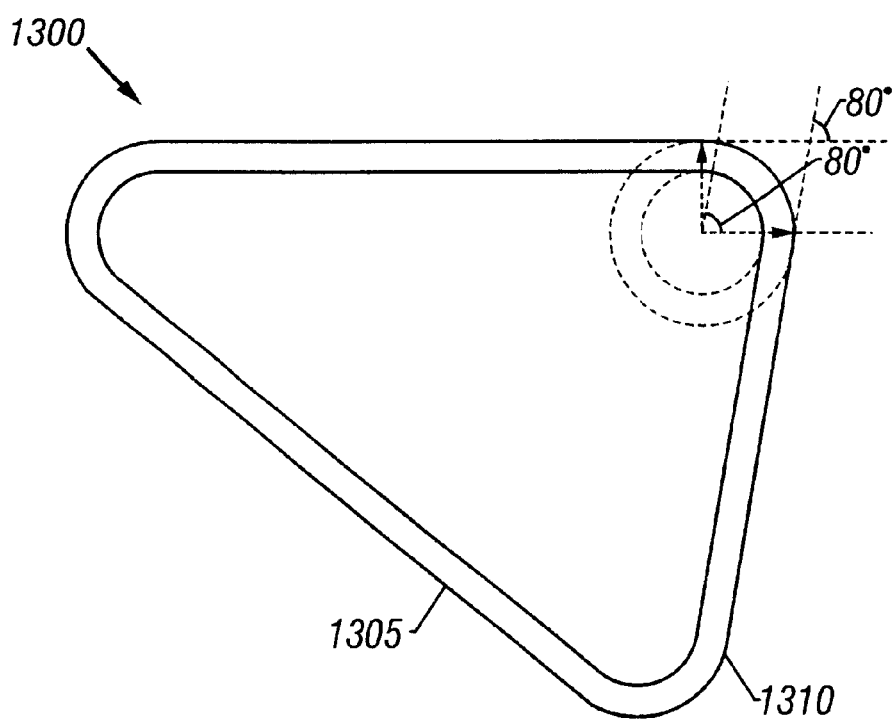

Referring to FIG. 13, a triangular Rogowski coil 1300 includes straight sections 1305 connected by rounded angles 1310 that are designed as portions of a circle. The size of the circle portion depends on the angle at which the straight sections meet. For example, if the straight sections meet at an 80° angle, then the circle portion included in the rounded angle spans 80°. Moreover, the tangent to the middle line of the circle portion is equal to the direction of the middle line of the straight portion at the point at which the circle portion meets the straight portion.

Figure 14A:
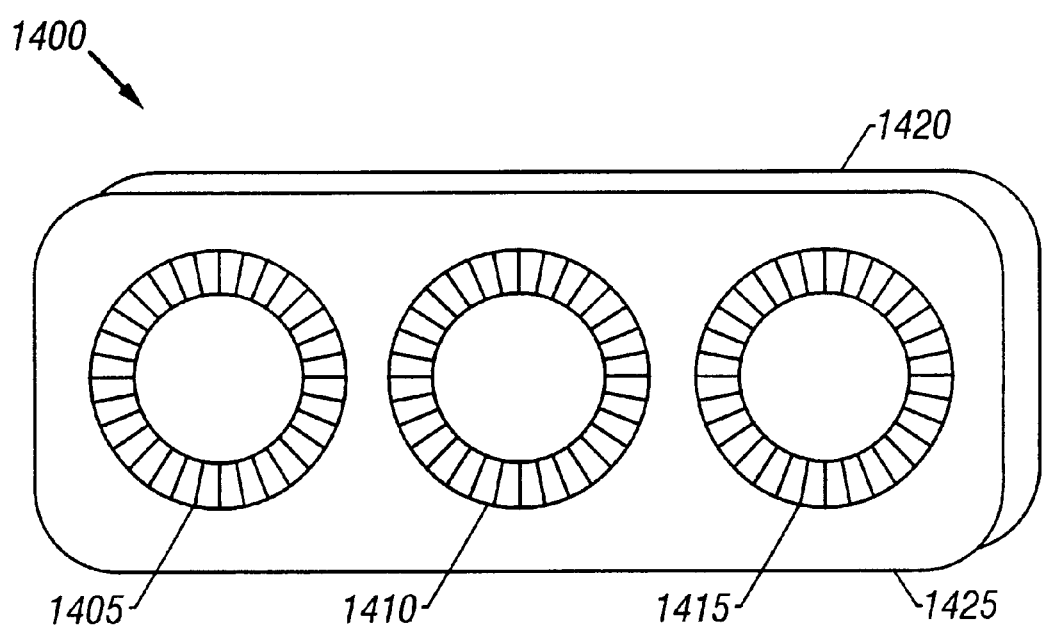
FIGS. 14A and 14B show an integrated Rogowski coil system for use in multi-phase circuits.

Referring to FIG. 14A, an integrated Rogowski coil system is used to measure current in each phase of a multi-phase circuit. For example, the Rogowski coil system 1400 is designed for use in three-phase circuits and therefore includes three Rogowski coils 1405, 1410, and 1415. The integrated Rogowski coil system 1400 shown in FIG. 14 is implemented on two PCBs 1420, 1425 using the two-loop, two-PCB design of the Rogowski coils of FIGS. 5A–9. This design decouples the loops of each of the coils onto, respectively, PCBs 1420, 1425.

Alternatively, the integrated Rogowski coil system may be implemented on a single PCB, in which case, the three Rogowski coils 1405, 1410, 1415 are traced into a single PCB much like the coil 330 is traced into PCB 335 in FIG. 3C. In this way, each of the loops in the coils 1405, 1410, and 1415 are coupled together, with the two loops of each coil traced on top of each other and interwoven.

Figure 14B:
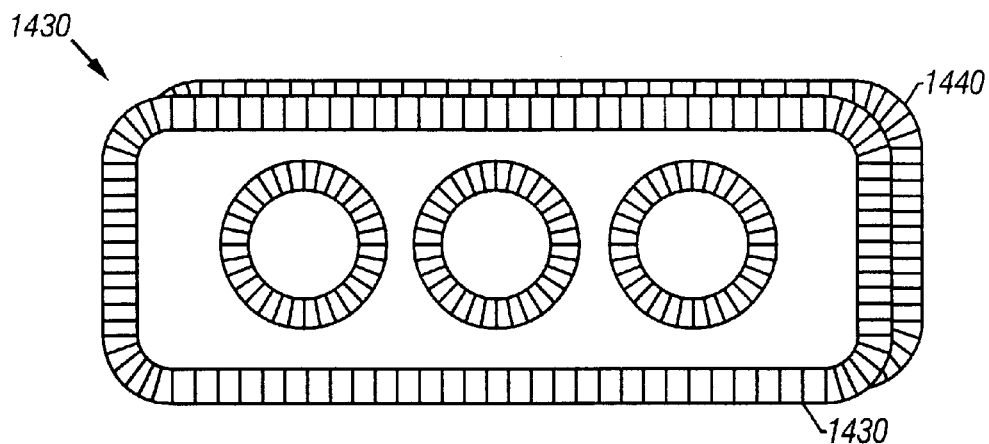

Referring also to FIG. 14B, an integrated Rogowski coil system 1430 may be designed to measure residual current through an arbitrary number of conductors. In the system 1430, additional loops 1435, 1440 are traced around an outer perimeter of the PCBs. Or, for a single-PCB design, a single loop may be traced around the outer perimeter of the PCB much like the coil 330 is traced into PCB 335 in FIG. 3C. In either case, such a design would be used to measure residual current through the conductors and therefore, would further improve measurement precision.

Figure 15A:
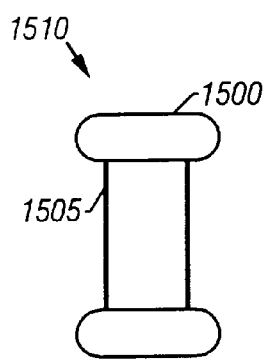
FIGS. 15A–15C show Rogowski coils with magnetically shielded ends.
Figure 15B:
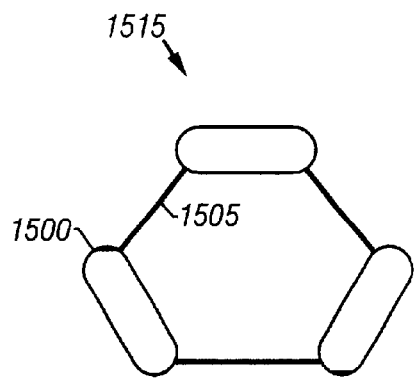
Figure 15C:
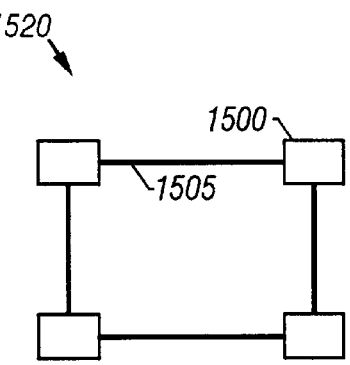

Referring to FIGS. 15A–15C, instead of designing the coil corners or ends as rounded angles as shown in FIGS. 11A, 12, and 13, the Rogowski coil may be designed with magnetically shielded corners or ends 1500 using standard blocks of silicon steel laminations that connect straight sections 1505 of the winding. These straight sections are wound onto a straight core. In this way, loop-winding discontinuity is accounted for at the corners or ends, and cross-sectional area can be manufactured more uniformly using the straight core. A fork-type Rogowski coil 1510 includes two straight sections joined by two blocks. A three-angled Rogowski coil 1515 includes three straight sections joined by three blocks. Likewise, a rectangular Rogowski coil 1520 includes four straight sections joined by four blocks. A shielded angle Rogowski coil is designed in a similar fashion as the variable shaped Rogowski coil detailed in FIGS. 11A, 12, and 13 and discussed above. Therefore, the shielded angle Rogowski coil may be implemented as a two-loop design on a single PCB (like the coil 330 of FIG. 3C) or it may be implemented as a two-loop design on two PCBs (like the coil in FIG. 5A).

Figure 16:
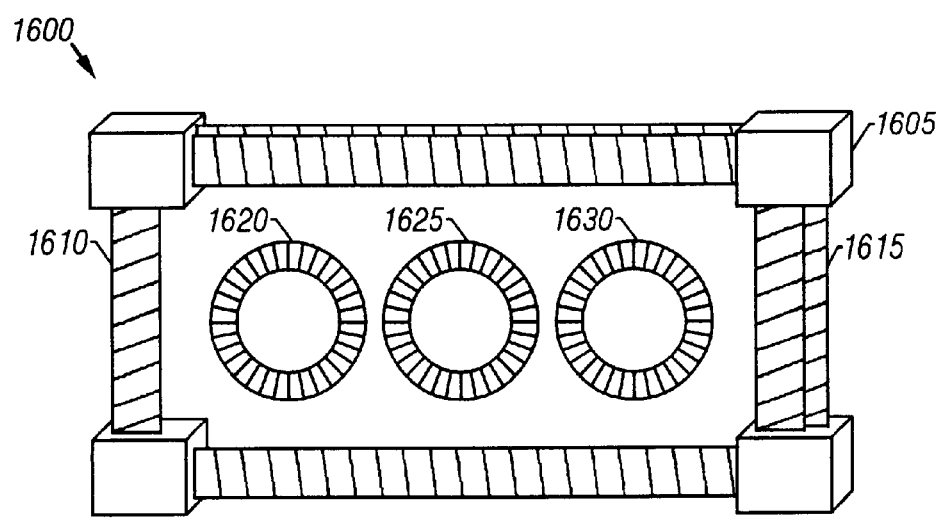
FIG. 16 shows an integrated Rogowski coil system with magnetically shielded ends.

Referring also to FIG. 16, an integrated Rogowski coil system 1600 is shown with magnetically shielded angles 1605, outer loops 1610, 1615 for measuring residual current through the conductors, and three inner Rogowski coils 1620, 1625, 1630 for measuring the current through the conductor in each phase. This system 1600 may be implemented in a three-phase circuit in which residual currents are measured much like the system 1430 of FIG. 14B. In contrast to the rounded corners in system 1430 of FIG. 14B, in the system 1600, the corners or ends that join the straight sections of the outer loops 1610, 1615 are magnetically shielded.

Other embodiments are within the scope of the following claims. For example, PCBs may be laminated together after the Rogowski coil is formed, thus forming a monolithic multi-layer printed circuit board assembly. Such an assembly is capable of measuring the individual currents and residual current flowing through an arbitrary number of primary conductors or conductor groups. The assembly protects and insulates the coil from moisture and electromagnetic shorts. An electronic measurement and/or acquisition circuit may be integrated as part of the assembly.

The output voltage integration may be performed using digital signal processing techniques.

What is claimed is:

1. A Rogowski coil that measures a current in a conductor, the Rogowski coil comprising:
    a first loop wound with a substantially constant winding density in a first direction around a first core that has a substantially constant cross section, and
    a second loop wound with a substantially constant winding density in a second direction around a second core that has a substantially constant cross section, the second loop connected in series with the first loop and decoupled from the first loop,
    wherein:
        a direction of the first loop is substantially perpendicular to the normal of the first core cross section, and
        a direction of the second loop is substantially perpendicular to the normal of the second core cross section.

2. The Rogowski coil of claim 1, wherein a voltage induced in a Rogowski coil that is placed around an electrical conductor is measured across the first and second loops of the Rogowski coil.

3. The Rogowski coil of claim 1, wherein the first loop is traced on a first printed circuit board, which forms the first cores and the second loop is traced on a second printed circuit board which forms the second core.

4. A system to measure a current in a conductor, the system comprising:
    a first Rogowski coil comprising:
        a first loop wound with a substantially constant winding density in a first direction around a first core that has a substantially constant cross section, and
        a second loop wound with a substantially constant winding density in a second direction around a second core that has a substantially constant cross section, the second loop connected in series with the first loop and decoupled from the first loop, such that a direction of the first loop is substantially perpendicular to the normal of the first core cross section, a direction of the second loop is substantially perpendicular to the normal of the second core cross section; and
    a second Rogowski coil identical in design to the first Rogowski coil and connected in series to the first Rogowski coil.

5. The Rogowski coil of claim 1, wherein the first and second cores are non-magnetic.

6. The Rogowski coil of claim 1, wherein the first and second loops are wound around their respective cores such that the Rogowski coil is rectangular in shape and has four straight sections coupled by four rounded sections.

7. The Rogowski coil of claim 6, wherein the first loop is traced on a first printed circuit board, which forms the first core, and the second loop is traced on a second printed circuit board, which forms the second core.

8. A Rogowski coil that measures a current in a conductor, the Rogowski coil comprising:
    a first loop traced with a substantially constant winding density in a first direction around a printed circuit board; and
    a second loop traced with a substantially constant winding density in a second direction around the printed circuit board, wherein:
the printed circuit board forms a rectangular core around which the first and second loops are wound, the rectangular core having a substantially constant cross section and including four straight sections coupled by four rounded sections,
the second loop is connected in series with the first loop and coupled to the first loop,
a direction of the first loop is substantially perpendicular to the normal of the core cross section, and
a direction of the second loop is substantially perpendicular to the normal of the core cross section.

9. The Rogowski coil of claim 1, wherein the first and second loops are wound around their respective cores such that the Rogowski coil is elliptical in shape and has two straight sections coupled by two rounded sections.

10. The Rogowski coil of claim 9, wherein the first loop is traced on a first printed circuit board, which thus forms the first core and the second loop is traced on a second printed circuit board, which thus forms the second core.

11. A Rogowski coil that measures a current in a conductor, the Rogowski coil comprising:
a first loop traced with a substantially constant winding density in a first direction around a printed circuit board; and
a second loop traced with a substantially constant winding density in a second direction around the printed circuit board,
wherein:
the printed circuit board forms an elliptical core around which the first and second loops are wound, the elliptical core having a substantially constant cross section and including two straight sections coupled by two rounded sections,
the second loop is connected in series with the first loop and coupled to the first loop,
a direction of the first loop is substantially perpendicular to the normal of the core cross section, and
a direction of the second loop is substantially perpendicular to the normal of the core cross section.

12. The Rogowski coil of claim 1, wherein the first and second loops are wound around their respective cores such that the Rogowski coil is triangular in shape and has three straight sections coupled by three rounded sections.

13. The Rogowski coil of claim 12, wherein the first loop is traced on a first printed circuit board, which thus forms the first core and the second loop is traced on a second printed circuit board, which thus forms the second core.

14. A Rogowski coil that measures a current in a conductor, the Rogowski coil comprising:
a first loop traced with a substantially constant winding density in a first direction around a printed circuit board; and
a second loop traced with a substantially constant winding density in a second direction around the printed circuit board,
wherein:
the printed circuit board forms a triangular core around which the first and second loops are wound, the triangular core having a substantially constant cross section and including three straight sections coupled by three rounded sections,
the second loop is connected in series with the first loop and coupled to the first loop,
a direction of the first loop is substantially perpendicular to the normal of the core cross section, and
a direction of the second loop is substantially perpendicular to the normal of the core cross section.

15. The Rogowski coil of claim 1, wherein the first and second loops are wound around their respective cores such that the Rogowski coil has two or more straight sections coupled by two or more coupling sections.

16. The Rogowski coil of claim 15, wherein the first loop is traced on a first printed circuit board, which thus forms the first core and the second loop is traced on a second printed circuit board, which thus forms the second core, and each of the two or more coupling sections is rounded.

17. A Rogowski coil that measures a current in a conductor, the Rogowski coil comprising:
a first loop traced with a substantially constant winding density in a first direction around a printed circuit board; and
a second loop traced with a substantially constant winding density in a second direction around the printed circuit board,
wherein:
the printed circuit board forms a core around which the first and second loops are wound, the core having a substantially constant cross section and including two or more straight sections coupled by two or more coupling sections,
the second loop is connected in series with the first loop and coupled to the first loop,
a direction of the first loop is substantially perpendicular to the normal of the core cross section, and
a direction of the second loop is substantially perpendicular to the normal of the core cross section.

18. The Rogowski coil of claim 17, wherein each of the two or more coupling sections includes a magnetically shielded joint.

19. The Rogowski coil of claim 15, wherein each of the two or more coupling sections includes a magnetically shielded joint.

20. A system comprising:
a first Rogowski coil comprising:
a first loop traced with a substantially constant winding density in a general direction around a first printed circuit board, and
a second loop traced with a substantially constant winding density in a general direction around a second printed circuit board, the second loop connected in series with the first loop and being decoupled from the first loop, and the general direction of the second loop being opposite to the general direction of the first loop; and
a second Rogowski coil comprising:
a third loop traced with a substantially constant winding density in a direction around the first printed circuit board, and
a fourth loop traced with a substantially constant winding density in a direction around the second printed circuit board, the fourth loop connected in series with the third loop and being decoupled from the third loop, and the general direction of the fourth loop being opposite to the general direction of the third loop;
each Rogowski coil measures a current through an electrical conductor on a phase of a multi-phase circuit when the electrical conductor is placed within the Rogowski coil.

21. The system of claim 20, further comprising a first perimeter loop traced on an outer perimeter of the first printed circuit board, and a second perimeter loop traced on an outer perimeter of the second printed circuit board, the first and second perimeter loops measuring residual current through an electrical conductor placed within one of the first and second Rogowski coils.

22. The system of claim 21, wherein the first and second printed circuit boards are laminated together to form a printed circuit assembly.

23. The system of claim 22, further comprising an electronic measurement and acquisition circuit that is integrated with the printed circuit board assembly.

24. A system comprising:
a first Rogowski coil comprising:
a first loop traced with a substantially constant winding density in a general direction around a printed circuit board, and
a second loop traced with a substantially constant winding density in a general direction around the printed circuit board, the second loop electrically connected in series with the first loop and being coupled with the first loop, and the general direction of the second loop being opposite to the general direction of the first loop; and
a second Rogowski coil comprising:
a third loop traced with a substantially constant winding density in a direction around the printed circuit board, the third loop decoupled from the first and second loops, and
a fourth loop traced with a substantially constant winding density in a general direction around the printed circuit board, the fourth loop electrically connected in series with the third loop, being coupled with the third loop and decoupled from the first and second loops, and the general direction of the fourth loop being opposite to the general direction of the third loop;
each Rogowski coil measures a current through an electrical conductor on a phase of a multi-phase circuit when the electrical conductor is placed within the Rogowski coil.

25. The system of claim 24, further comprising first and second perimeter loops traced on an outer perimeter of the printed circuit board, the perimeter loops measuring residual current through an electrical conductor placed within one of the first and second Rogowski coils.

26. The Rogowski coil of claim 17, wherein each of the two or more coupling sections is rounded.

27. The system of claim 20 in which the third loop is decoupled from the first loop and the fourth loop is decoupled from the second loop.

28. The system of claim 20 in which:
the first printed circuit board and the first loop form a first core that has a substantially constant cross section such that the general direction of the first loop is substantially perpendicular to the normal of the first core cross section;
the second printed circuit board and the second loop form a second core that has a substantially constant cross section such that the general direction of the second loop is substantially perpendicular to the normal of the second core cross section;
the first printed circuit board and the third loop form a third core that has a substantially constant cross section such that the general direction of the third loop is substantially perpendicular to the normal of the third core cross section; and
the second printed circuit board and the fourth loop form a fourth core that has a substantially constant cross section such that the general direction of the fourth loop is substantially perpendicular to the normal of the fourth core cross section.

29. The system of claim 24 in which:
the printed circuit board and the first and second loops form a first core that has a substantially constant cross section;
the first direction of the first loop is substantially perpendicular to the normal of the first core cross section and the second direction of the second loop is substantially perpendicular to the normal of the first core cross section;
the printed circuit board and the third and fourth loops form a second core that has a substantially constant cross section; and
the first direction of the third loop is substantially perpendicular to the normal of the second core cross section and the second direction of the fourth loop is substantially perpendicular to the normal of the second core cross section.

* * * * *